(12) United States Patent
Tanino et al.

(10) Patent No.: US 6,203,772 B1
(45) Date of Patent: *Mar. 20, 2001

(54) SINGLE CRYSTAL SIC AND A METHOD OF PRODUCING THE SAME

(75) Inventors: Kichiya Tanino; Masanobu Hiramoto, both of Sanda (JP)

(73) Assignee: Nippon Pillar Packing Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/186,662

(22) Filed: Nov. 6, 1998

(30) Foreign Application Priority Data

Nov. 17, 1997 (JP) ............................................ 9-315127

(51) Int. Cl.$^7$ .............................. C30B 1/04; C30B 29/36
(52) U.S. Cl. .................................. 423/345; 117/4; 117/7; 117/9; 117/951
(58) Field of Search ................................ 117/1, 4, 7, 951, 117/84, 94, 97; 428/446, 620; 423/345

(56) References Cited

U.S. PATENT DOCUMENTS 5,846,638 * 12/1998 Meissner ............................. 428/220

6,053,973 * 4/2000 Tanino et al. .............................. 117/4

OTHER PUBLICATIONS

Copending Application 09/147,620, filed Feb. 3, 1999.*

* cited by examiner

Primary Examiner—Benjamin L. Utech
Assistant Examiner—Donald L. Champagne
(74) Attorney, Agent, or Firm—Jones, Tullar & Cooper, P.C.

(57) ABSTRACT

The single crystal SiC according to the present invention is produced in the following manner. Two complexes M in each of which a polycrystalline film 2 of β-SiC (or α-SiC) is grown on the surface of a single crystal α-SiC substrate 1 by thermochemical deposition, and the surface 2a of the polycrystalline film 2 is ground so that the smoothness has a surface roughness of 200 angstroms RMS or smaller, preferably 100 to 50 angstroms RMS are subjected to a heat treatment under a state where the complexes are closely fixed to each other via their ground surfaces 2a', at a temperature of 2,000° C. or higher and in an atmosphere of a saturated SiC vapor pressure, whereby the polycrystalline films 2 of the complexes M are recrystallized to grow a single crystal which is integrated with the single crystal α-SiC substrates 1. Large-size single crystal SiC in which impurities, micropipe defects, and the like do not remain, and which has high quality can be produced with high productivity.

10 Claims, 2 Drawing Sheets

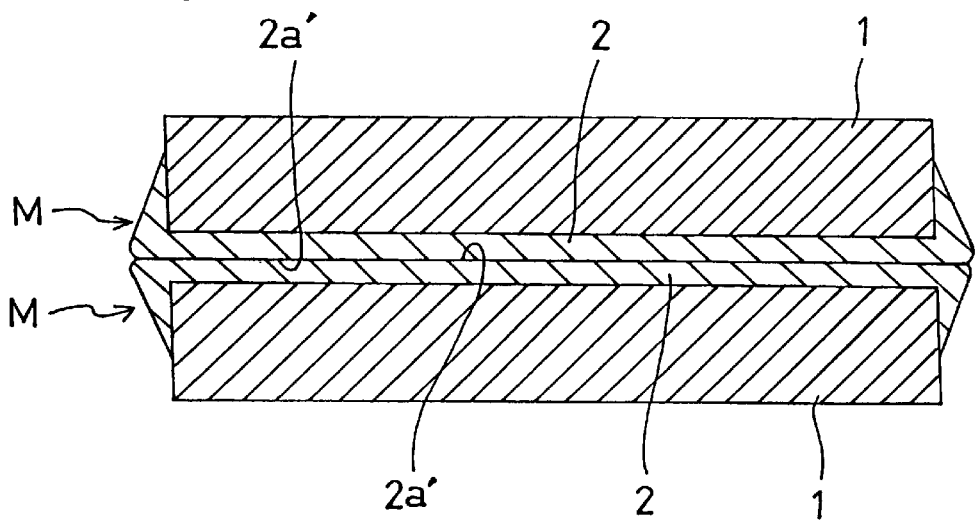
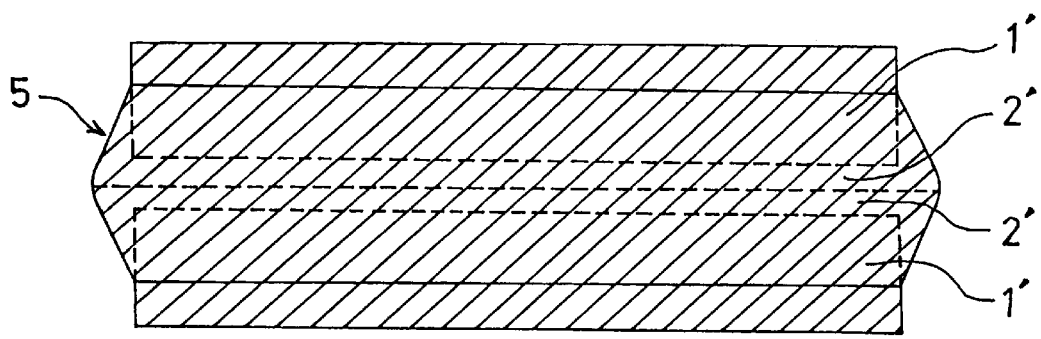

SINGLE CRYSTAL SIC AND A METHOD OF PRODUCING THE SAME

BACKGROUND OF THE INVENTION

1. Field of the Invention

The present invention relates to a single crystal SiC and a method of producing the same, and more particularly to a single crystal SiC which is used as a semiconductor substrate wafer for a light-emitting diode, an X-ray optical device such as a monochromatic sorter, a high-temperature semiconductor electronic element, and a power device, and also to a method of producing the single crystal SiC.

2. Description of the Prior Art

SiC (silicon carbide) is superior in heat resistance and mechanical strength, and also has good resistance to radiation. In addition, it is easy to achieve valence control of electrons and holes by doping an impurity. Moreover, SiC has a wide band gap (for example, single crystal 6H—SiC has a band gap of about 3.0 eV, and single crystal 4H—SiC has a band gap of 3.26 eV). Therefore, it is possible to realize a large capacity, a high frequency, a high dielectric strength, and a high environmental resistance to which cannot be realized by existing semiconductor materials such as Si (silicon) and GaAs (gallium arsenide). For these reasons, single crystal SiC receives attention and is expected to be used as a semiconductor material for a next-generation power device.

As a method of growing (producing) a single crystal SiC of this type, the Achison method and the sublimation and recrystallization method are employed. These methods, are generally known as industrial methods for producing an SiC abrasive material. In the Achison method, a seed crystal substrate is heated from the outer circumference by using a high frequency electrode, so as to generate many nuclei in a center portion of the seed crystal substrate, whereby a plurality of spiral crystal growths are developed, which are centered at the center portion of the seed crystal substrate. In the sublimation and recrystallization method, powder SiC produced by the Achison method is used as a raw material, and a crystal is grown on a single crystal nucleus.

In the Achison method of the above-described conventional production methods, however, a single crystal is grown slowly over a long time period, so that the crystal growth rate is as low as about 1 mm/hr. In addition, a large number of crystal nuclei are generated in an initial growth stage, and they propagate to an upper portion of the crystal as the crystal growth advances. Thus, it is difficult to singly obtain a large-size single crystal.

In the sublimation and recrystallization method, a high-speed growth of about 1 mm/hr is adopted mainly for an economical reason (production cost), so that impurities and pin holes which have a diameter of several microns and which pass through the crystal in the growing direction are likely to remain at about 100 to 1,000/cm² in a growing crystal. Such pin holes are called micropipe defects and cause a leakage current when a semiconductor device is fabricated. Accordingly, there exists a problem in that a single crystal SiC having sufficiently good quality cannot be obtained. In the Achison method and the sublimation and recrystallization method, moreover, it is very difficult from a technical point of view to maintain cleanness of the atmosphere in the vicinity of a growing crystal, thereby producing a problem in that the quality is impaired also by contamination from the outside in the vicinity of a single crystal. These problems block a practical use of a single crystal SiC which has superior characteristics as compared with other existing semiconductor materials such as Si and GaAs as described above.

SUMMARY OF THE INVENTION

It is an object of the present invention to provide a large-size single crystal SiC in which impurities, micropipe defects, and the like do not remain, in which contamination from the outside is suppressed to a minimum level, and which has high quality, and to a method of producing a single crystal SiC which is large and has high quality, and which can expedite the practical use of SiC as a semiconductor material.

In order to attain the above-mentioned object, the single crystal SiC of the invention is characterized in that two complexes in each of which a polycrystalline film of β-SiC or α-SiC is grown on a surface of a single crystal α-SiC substrate by thermochemical deposition are subjected to a heat treatment under a state where the complexes are piled via the surfaces of the polycrystalline films of the complexes so that crystal orientations of the single crystal α-SiC substrates of the complexes are directed in the same direction, whereby the polycrystalline films of the complexes are recrystallized to integrally grow a single crystal on the single crystal α-SiC substrates of the complexes.

In order to attain the same object, the method of producing a single crystal SiC according to the present invention is characterized in that two complexes are produced respectively by growing a polycrystalline film of β-SiC or α-SiC on a surface of a single crystal α-SiC substrate by thermochemical deposition, the two complexes are piled via surfaces of the polycrystalline films of β-SiC or α-SiC so that crystal orientations of the single crystal α-SiC substrates of the complexes are directed to the same direction, and the two piled complexes are then heat-treated, whereby the polycrystalline films of the complexes are recrystallized to grow a single crystal which is integrated with the single crystal α-SiC substrates of the complexes.

According to the present invention having the above-mentioned characteristics, two complexes in each of which a polycrystalline film of β-SiC or α-SiC is grown on a surface of a single crystal α-SiC substrate by thermochemical deposition are piled via the surfaces of the polycrystalline films and then collectively heat-treated, whereby each of the polycrystalline films of the complexes is recrystallized so that a single crystal which is integrated with each of the single crystal α-SiC substrates of the complexes, and which is large and particularly thick can be grown.

Furthermore, the heat treatment is performed under a state where the two complexes are piled via the surfaces of the polycrystalline films of the complexes, and particularly a state where the surfaces of the polycrystalline films are smoothly ground and the smooth surfaces are closely fixed to each other. This suppresses contamination which is caused by adhesion of suspended substances and the like in the vicinity of the surfaces of the polycrystalline films, to a minimum level. Moreover, even when the ambient atmosphere is varied during the heat treatment, a phenomenon by which the variation of the ambient atmosphere causes a surface portion of the polycrystalline films to decompose and disappear, or crystals deposited in the vicinity to adhere to the surfaces of the polycrystalline films can be suppressed to a minimum level. Therefore, impurities, micropipe defects, and the like do not substantially remain. Furthermore, contamination from the outside, and an effect of the variation of the ambient atmosphere during the heat treatment can be suppressed to a minimum level so that a large-size single crystal SiC which stably has very high quality is obtained with high productivity. Thus, it is possible to attain the effect of expediting the practical use of single crystal SiC which is superior in a large capacity, a high frequency, a high dielectric strength, and a high resistance to environments to existing semiconductor materials such as Si (silicon) and GaAs (gallium arsenide) and which is expected as a semiconductor material for a power device.

Other objects and effects of the present invention will be clarified in embodiments which will be described below.

BRIEF DESCRIPTION OF THE DRAWINGS

FIG. 3 is a schematic view showing a state after a third step of heat treatment of the production method; and FIG. 4 is a schematic view showing a final state after the third step of heat treatment of the production method.

PREFERRED EMBODIMENTS OF THE INVENTION

Hereinafter, an embodiment of the present invention will be described with reference to the drawings.

Figure 1:
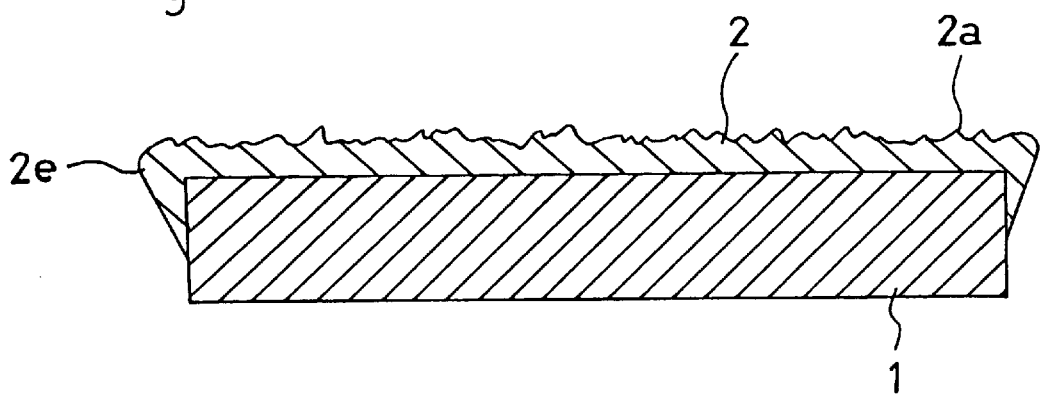
FIG. 1 is a schematic view showing a final state according to the present invention after a first step of growing a film by thermochemical deposition according to the method of producing a single crystal SiC.

FIGS. 1 to 4 are schematic views illustrating the method of producing a single crystal SiC according to the invention, in the sequence of production steps. In FIG. 1, 1 denotes a single crystal hexagonal α-SiC substrate (6H type or 4H type). The single crystal α-SiC substrate 1 is produced by the sublimation and recrystallization method or the Achison method. A polycrystalline cubic β-SiC film 2 is grown by thermochemical deposition in the range of 1,300 to 1,900° C. so as to form an end portion 2e over the whole periphery of the side face of the single crystal α-SiC substrate 1.

Figure 2:
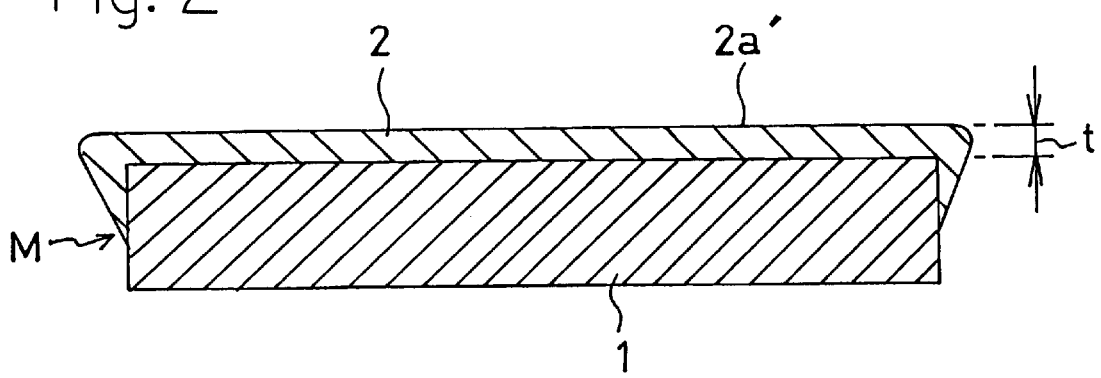
FIG. 2 is a schematic view showing a final state after a second step of grinding the surface of the grown film by the production method.

Immediately after the film growth, as shown in FIG. 1, the surface 2a of the polycrystalline β-SiC film 2 is in a rough face state where small irregularities are scattered. The surface 2a of the polycrystalline β-SiC film 2 in the rough surface state is ground so that the smoothness has surface roughness of 200 angstroms RMS or smaller, preferably 100 to 50 angstroms RMS, thereby producing a complex M. As shown in FIG. 2, the complex M has the polycrystalline β-SiC film 2 which has a clean ground surface $2a'$ without irregularities, and a thickness t that is uniform over the whole area.

Next, as shown in FIG. 3, two thus configured complexes M are closely fixed to each other via the smooth clean ground surfaces $2a'$ of the polycrystalline β-SiC films 2 so that crystal orientations of the single crystal α-SiC substrates 1 of the complexes M are directed in the same direction.

Thereafter, a heat treatment is performed in which the whole of the two complexes M which are closely fixed to each other as described above is held for several hours in the atmosphere of a saturated SiC vapor pressure and at a temperature of 2,000° C. or higher, preferably in the range of 2,200 to 2,400° C. In accordance with the crystal growth of the single crystal α-SiC substrates 1 of the complexes M, each of the polycrystalline cubic β-SiC films 2 is recrystallized, so that, as shown in FIG. 4, the polycrystalline β-SiC films 2 are formed into single crystal portions 2' which are oriented in the same direction as the crystal orientations of the single crystal α-SiC substrates 1. The single crystal portions 2' are integrated with single crystals 1' of the substrates 1, with the result that a single crystal 5 which is large or namely thick is grown. After the heat treatment, as apparent from FIG. 4, the interface which clearly exists between the ground surfaces $2a'$ of the polycrystalline β-SiC films 2 before the heat treatment is fused and integrated so as to disappear.

As described above, the two complexes M in each of which the surface 2a of the polycrystalline cubic β-SiC film 2 that is grown on the single crystal α-SiC substrate 1 by thermochemical decomposition is mirror-polished so that the smoothness has surface roughness of 200 angstroms RMS or smaller, preferably 100 to 50 angstroms RMS are heat-treated while crystal orientations of the single crystal α-SiC substrates 1 of the complexes are directed in the same direction, and the smooth ground surfaces $2a'$ are closely fixed to each other. Therefore, contamination which is caused by adhesion of suspended substances and the like in the vicinity to the surfaces $2a'$ of the polycrystalline β-SiC films 2 can be suppressed to a minimum level. Even when variation of the ambient atmosphere, for example, variation of the saturated SiC vapor pressure during the heat treatment occurs, moreover, also a phenomenon that the variation of the ambient atmosphere causes portions of surfaces $2a'$ of the polycrystalline β-SiC films 2 to be decomposed and disappear, or crystals depositing onto the vicinity to adhere to the surfaces $2a'$ of the polycrystalline β-SiC films 2 can be suppressed to a minimum level. Therefore, the remaining of impurities, micropipe defects, and the like, contamination from the outside, and the formation of grain boundaries in the interface of the complexes M are prevented from occurring. As a result, a stable large-size single crystal SiC which has very high quality is obtained with high productivity.

In the embodiment described above, as the polycrystalline films, the polycrystalline β-SiC films 2 are used. Alternatively, complexes in each of which a polycrystalline hexagonal (6H) α-SiC substrate of a high impurity ($10^{14}$ atm/cm$^3$ or less) is grown on the surface of the single crystal α-SiC substrate 1 may be heat-treated. In the alternative, it is possible to obtain large-size single crystal SiC with higher productivity as compared with the above-described case where the polycrystalline β-SiC films 2 are used.

What is claimed is:

1. A Single crystal SiC having:
   a single crystal α-SiC substrate; and
   a polycrystalline film of β-SiC or α-SiC grown on the single crystal surface by thermochemical deposition, said single crystal substrate and said polycrystalline film of β-SiC or α-SiC forming a complex said complex joined to a further complex to form two complexes, said two complexes having been subjected to a heat treatment under a state where said complexes were piled via the surfaces of said polycrystalline films so that crystal orientations of said single crystal α-SiC substrates of said complexes were directed to the same direction, whereby said polycrystalline films of said complexes were recrystallized to integrally grown a single crystal on said single crystal α-SiC substrates of said complexes.

2. The single crystal SiC according to claim 1, wherein the surfaces of said polycrystalline films of said two complexes were ground so that the smoothness of said surfaces has a roughness of 200 angstroms RMS or smaller, and wherein said two complexes were heat-treated under a state where said smooth surfaces were closely fixed to each other.

3. The single crystal SiC according to claim 1, wherein the surfaces of said polycrystalline films of said two complexes were ground so that the smoothness of said surfaces has a roughness of 100 to 50 angstroms RMS or smaller, and wherein said two complexes were heat-treated under a state where said smooth surfaces were closely fixed to each other.

4. A method of producing a single crystal SiC, comprising the steps of:

producing two complexes by growing a polycrystalline film of β-SiC or α-SiC on a surface of a single crystal α-SiC substrate by thermochemical deposition;

directing the crystal orientations of the single crystal α-SiC substrates of the two complexes, piled via surfaces of said polycrystalline films, in the same direction; and heat treating the two piled complexes, whereby the polycrystalline films of the complexes are recrystallized to grow a single crystal which is integrated with the single crystal α-SiC substrates of the complexes.

5. The method of producing a single crystal SiC according to claim 4, wherein the surfaces of the polycrystalline films of the two complexes are ground so that the smoothness of the surfaces has a roughness of 200 angstroms RMS or smaller, and wherein the two complexes are heat-treated under a state where the smooth surfaces are closely fixed to each other.

6. The method of producing a single crystal SiC according to claim 4, wherein the surfaces of the polycrystalline films of the two complexes are ground so that the smoothness of the surfaces has a roughness of 100 to 50 angstroms RMS or smaller, and wherein the two complexes are heat-treated under a state where the smooth surfaces are closely fixed to each other.

7. The method of producing a single crystal SiC according to claim 4, wherein said heat treatment of the complexes is performed at a temperature of 2,000° C. or higher and in an atmosphere of a saturated SiC vapor pressure or the vicinity thereof.

8. The method of producing a single crystal SiC according to claim 5, wherein said heat treatment of the complexes is performed at a temperature of 2,000° C. or higher and in an atmosphere of a saturated SiC vapor pressure or the vicinity thereof.

9. The method of producing a single crystal SiC according to claim 6, wherein said heat treatment of the complexes is performed at a temperature of 2,000° C. or higher and in an atmosphere of a saturated SiC vapor pressure or the vicinity thereof.

10. The method of producing a single crystal SiC according to claim 4, wherein the temperature of said heat treatment of the complexes is set to be in a range of 2,200 to 2,400° C.

* * * * *